US012599016B2

(12) United States Patent
He et al.

(10) Patent No.: US 12,599,016 B2
(45) Date of Patent: Apr. 7, 2026

(54) FLIP CHIP PACKAGE

(71) Applicant: Dell Products L.P., Round Rock, TX (US)

(72) Inventors: Qinghong He, Austin, TX (US); Isaac Qin Wang, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 338 days.

(21) Appl. No.: 18/363,275

(22) Filed: Aug. 1, 2023

(65) Prior Publication Data

US 2025/0046697 A1 Feb. 6, 2025

(51) Int. Cl.
| | |
|---|---|
| *H01L 23/498* | (2006.01) |
| *H01L 21/48* | (2006.01) |
| *H01L 23/00* | (2006.01) |
| *H01R 12/79* | (2011.01) |
| *H01R 43/26* | (2006.01) |
| *H05K 1/181* | (2026.01) |

(52) U.S. Cl.
CPC .... *H01L 23/49838* (2013.01); *H01L 21/4857* (2013.01); *H01L 23/49816* (2013.01); *H01L 23/49822* (2013.01); *H01L 24/16* (2013.01); *H01L 24/81* (2013.01); *H01R 12/79* (2013.01); *H01R 43/26* (2013.01); *H05K 1/181* (2013.01); *H01L 24/32* (2013.01); *H01L 2224/16227* (2013.01); *H01L 2224/32225*

(2013.01); *H01L 2224/73* (2013.01); *H01L 2224/73204* (2013.01); *H01L 2224/81* (2013.01); *H05K 2201/10356* (2013.01)

(58) Field of Classification Search
CPC ........... H01L 23/49838; H01L 21/4857; H01L 23/49816
USPC ........................................................ 361/783
See application file for complete search history.

(56) References Cited

U.S. PATENT DOCUMENTS

| | | | | |
|---|---|---|---|---|
| 8,097,490 | B1 * | 1/2012 | Pagaila | H01L 23/5386 438/618 |
| 9,379,469 | B1 * | 6/2016 | Shahani | H05K 3/3447 |
| 2013/0099375 | A1 * | 4/2013 | Kim | H01L 23/49827 257/E23.06 |
| 2022/0037248 | A1 * | 2/2022 | Choi | H01L 25/18 |

* cited by examiner

*Primary Examiner* — Andargie M Aychillhum
(74) *Attorney, Agent, or Firm* — McDermott Will & Schulte LLP

(57) ABSTRACT

In one or more embodiments, a chip may be formed with a first set of contacts on a first surface layer and a second set of contacts on a second surface layer opposite the first surface layer. The first set of contacts may be communication (IO) contacts and the second set of contacts may be power contacts, including ball grid array (BGA) balls and capacitors. A PCB may be configured with a chip receiving area capable of receiving the second set of contacts for various chips.

20 Claims, 7 Drawing Sheets

FLIP CHIP PACKAGE

BACKGROUND

Field of the Disclosure

This disclosure relates generally to information handling systems and more particularly to integrated chip packaging for use in information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments may be generally directed to a chip package, comprising a substrate comprising a plurality of layers, wherein a first surface layer of the plurality of layers comprises a first set of contacts, wherein each contact in the first set of contacts is a first contact type; and a second surface layer of the plurality of layers opposite the first surface layer comprises a second set of contacts, wherein each contact in the second set of contacts is a second contact type that is different than the first contact type; and a silicon die mounted to the first surface layer. In some embodiments, the first set of contacts comprises input/output (I/O) contacts. In some embodiments, the first set of contacts is arranged proximate an edge of the substrate. In some embodiments, the substrate is substantially rectangular and defined by two end edges and two side edges, wherein the two side edges are longer than the two end edges, wherein the first set of contacts is arranged proximate to a side edge of the substrate. In some embodiments, the substrate is substantially rectangular and defined by two end edges and two side edges, wherein the two side edges are longer than the two end edges, wherein the first set of contacts is arranged proximate to an end edge of the substrate. In some embodiments, the chip package further comprises a first surface mount connector coupled to the first set of contacts. In some embodiments, the second set of contacts comprises power contacts.

Embodiments may be generally directed to a system comprising a printed circuit board (PCB) with a mainboard connector, a chip package comprising: a substrate comprising a plurality of layers, wherein: a first surface layer of the plurality of layers comprises a first set of contacts, wherein each contact in the first set of contacts is a first contact type; and a second surface layer of the plurality of layers opposite the first surface layer comprises a second set of contacts, wherein each contact in the second set of contacts is a second contact type that is different than the first contact type; and a silicon die mounted to the first surface layer; and a connector coupling the first set of contacts to the mainboard connector.

In some embodiments, the first set of contacts comprises input/output (I/O) contacts. In some embodiments, the first set of contacts is arranged proximate an edge of the substrate. In some embodiments, the substrate is substantially rectangular and defined by two end edges and two side edges, wherein the two side edges are longer than the two end edges, wherein the first set of contacts is arranged proximate to a side edge of the substrate. In some embodiments, the substrate is substantially rectangular and defined by two end edges and two side edges, wherein the two side edges are longer than the two end edges, wherein the first set of contacts is arranged proximate to an end edge of the substrate. In some embodiments, the connector coupling the first set of contacts to the mainboard connector comprises: a surface mount connector mounted on the substrate; and a cable connecting the surface mount connector to the mainboard connector. In some embodiments, the connector coupling the first set of contacts to the mainboard connector comprises: a compression connector mounted on the substrate; and a cable connecting the surface mount connector to the mainboard connector.

Embodiments may be generally directed to a method of connecting a chip package to a printed circuit board (PCB). The method may comprise: forming a substrate comprising a plurality of layers; mounting a silicon die to the first surface layer; mounting the substrate in a chip receiving area on a PCB, wherein the second set of contacts are connected to chip connection points; contacting a first end of a connector to the first set of contacts; and contacting a second end of the connector to a mainboard connector on the PCB. Forming a substrate comprising a plurality of layers may comprise: forming a first surface layer of the plurality of layers with a first set of contacts, wherein each contact in the first set of contacts is a first contact type; and forming a second surface layer of the plurality of layers opposite the first surface layer with a second set of contacts, wherein each contact in the second set of contacts is a second contact type that is different than the first contact type.

In some embodiments, the connector comprises a flexible cable. In some embodiments, contacting the first end of the connector to the first set of contacts comprises: positioning a compression connector relative to the first set of contacts; and contacting a first end of a board connector with the compression connector; and contacting the second end of the connector to the mainboard connector on the PCB comprises contacting a second end of the board connector to the mainboard connector. In some embodiments, forming the first surface layer of the plurality of layers with the first set of contacts comprises forming the first set of contacts proximate an end edge of the substrate. In some embodiments, forming the first surface layer of the plurality of layers with the first set of contacts comprises forming the first set of contacts proximate a side edge of the substrate. In some embodiments, forming the first surface layer of the plurality of layers with the first set of contacts comprises forming the first set of contacts proximate two or more edges of the substrate.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
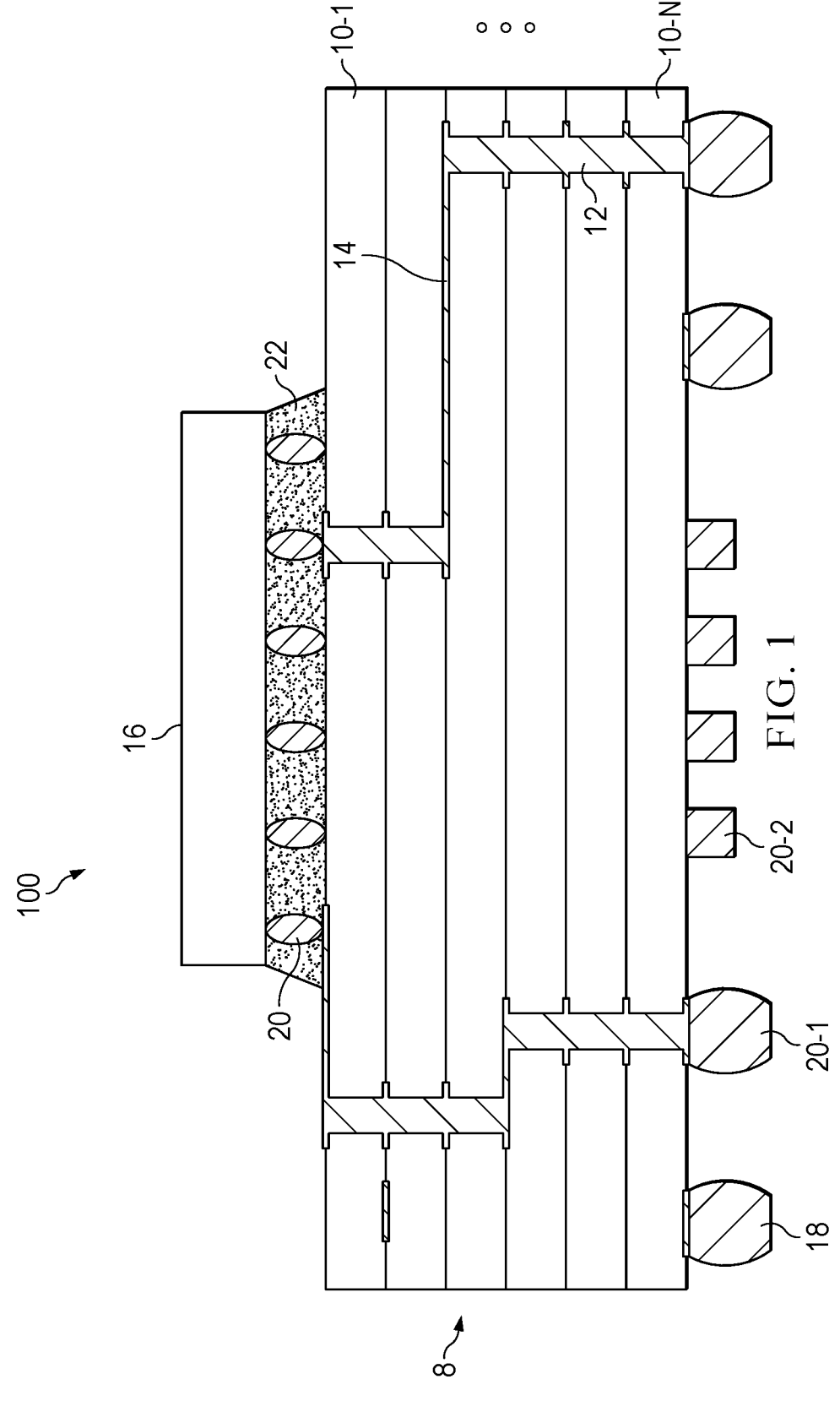
FIG. 1 depicts a cutaway side view of one example of a chip package in which all contacts are formed on a single surface layer of the chip package.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, a and network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPS may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

Turning now to FIG. 1, an example chip package 100 generally comprises a plurality of layers 10-1 to 10-N of a substrate, with one or more vias 12 connecting two or more layers 10. Each layer 10 may have one or more traces 14 connected to a via 12. Silicon die 16 may be mounted on first layer 10-1 (which may be referred to as top layer 10-1 as it pertains to FIG. 1) for connection to vias 12 and/or traces 14. In some embodiments, silicon die 16 is connected to one or more of first layer 10-1 and traces 14 using controlled collapse chip connection (C4) bump 20 and underfill 22.

Second layer 10-N (which may be referred to as bottom layer 10-6 as it pertains to PCB 100 having six layers 10 in FIG. 1) may have a first set of contacts 118 (e.g., input/output (I/O) contacts 18) connected to vias 12 and/or traces 14. In some embodiments, I/O contacts 18 may be high-speed input/output (HSIO) balls.

As depicted in FIG. 1, chip package 100 may further comprise a second set of contacts 20 (e.g., power contacts 20) for receiving electrical power into silicon die 16. Power contacts 20 may include different types (e.g., power contacts 20-1 may be ball grid array (BGA) connectors associated with receiving electrical power and power contacts 20-2 may be capacitors also associated with electrical power.

As processor systems on a chip (SOC) continue incorporating more functions and power by either adding more chips in the package or more sub-function areas in silicon die 16, the number of I/O contacts 18 and/or power contacts 20 that are required to supply power or communicate with the mainboard also increases. As a result, more layers 10 or high-density interconnect (HDI) material may be needed to fan out the additional signals.

While PCB modulization by subsystem can substantially reduce complexity and save costs, platform-specific design decisions put constraints on what can be modularized. This is because power contacts 20 are typically near the center of chip package 100 in a chip receiving area, which makes the power delivery plane to almost always overlap with where I/O contacts 18 are arranged in a chip package. For example, some processors share the same footprint, depending on the base power design of the system, but each processor may have a unique solution. Furthermore, high speed signals cannot be routed underneath inductors, which often times increases the PCB layer count to make up the necessary area in the region.

In addition to affecting power contacts 20, for very wide busses (e.g. for double data rate (DDR)/low-power double data rate (LPDDR)) associated with memory devices, the fixed location of I/O contacts 18 on the bottom layer 10-N of chip package 100 puts a constraint on where memory modules and devices must be placed, subsequently limiting the feasibility of modulization.

Embodiments disclosed herein include a chip package and a PCB that allow more I/O contacts 18 and power contacts 20 in the same footprint (e.g., relative to a chip receiving area), a separation between power and signals and an easier modularization.

Figure 2:
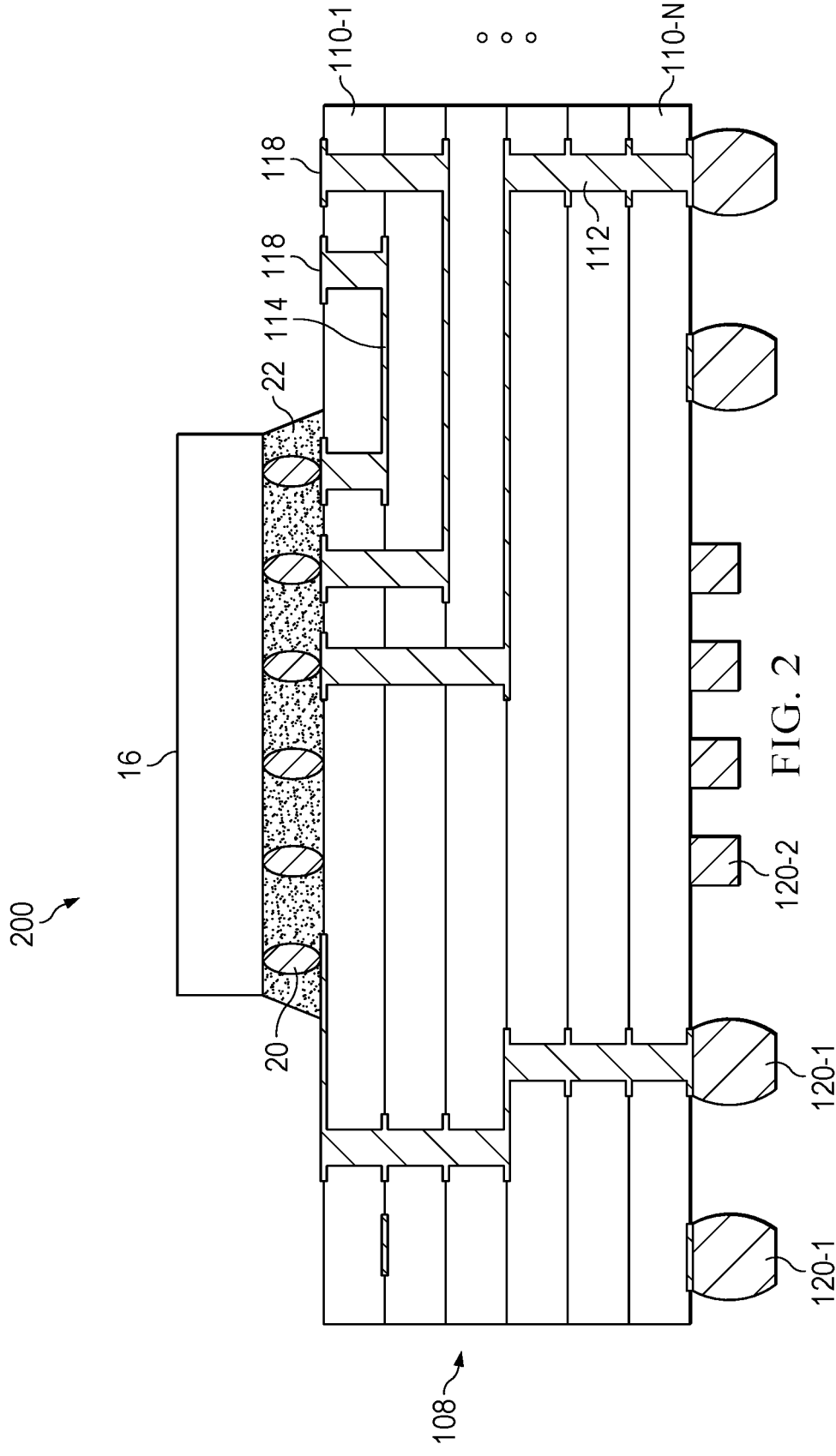
FIG. 2 depicts a cutaway side view of one embodiment of a chip package in which a first set of contacts are located on a first surface layer of the chip package and a second set of contacts are located on a second surface layer of the chip package opposite the first surface layer.

Referring to FIG. 2, chip package 200 generally comprises a plurality of layers 110-1 to 110-N of substrate 108, with one or more vias 112 connecting two or more layers 110. Each layer 110 may have one or more traces 114 connected to a via 112. Silicon die 16 may be mounted on first layer 110-1 (which may be referred to as top layer 110-1 as it pertains to FIG. 2) for connection to vias 112 and/or traces 114. A first set of contacts 118 (e.g., I/O contacts 118) may be formed on first layer 110-1, wherein first set of contacts 118 on first layer 110-1 are all of the same functionality type (e.g., communications). In some embodiments, I/O contacts 118 may comprise contact pads. A second set of contacts 120 (e.g., power contacts 120) may be formed on a second layer 110-N (which may be referred to as bottom layer 110-6 as it pertains to chip package 200 having six layers 110 in FIG. 2) for connection to vias 112 and/or traces 114, wherein power contacts 120 are all of the same functionality type (e.g., power) but may vary. For example, as depicted in FIG. 2, power contacts 120 may include, for example, ball grid array (BGA) type power contacts 120-1 and capacitors 120-2.

Figure 3:
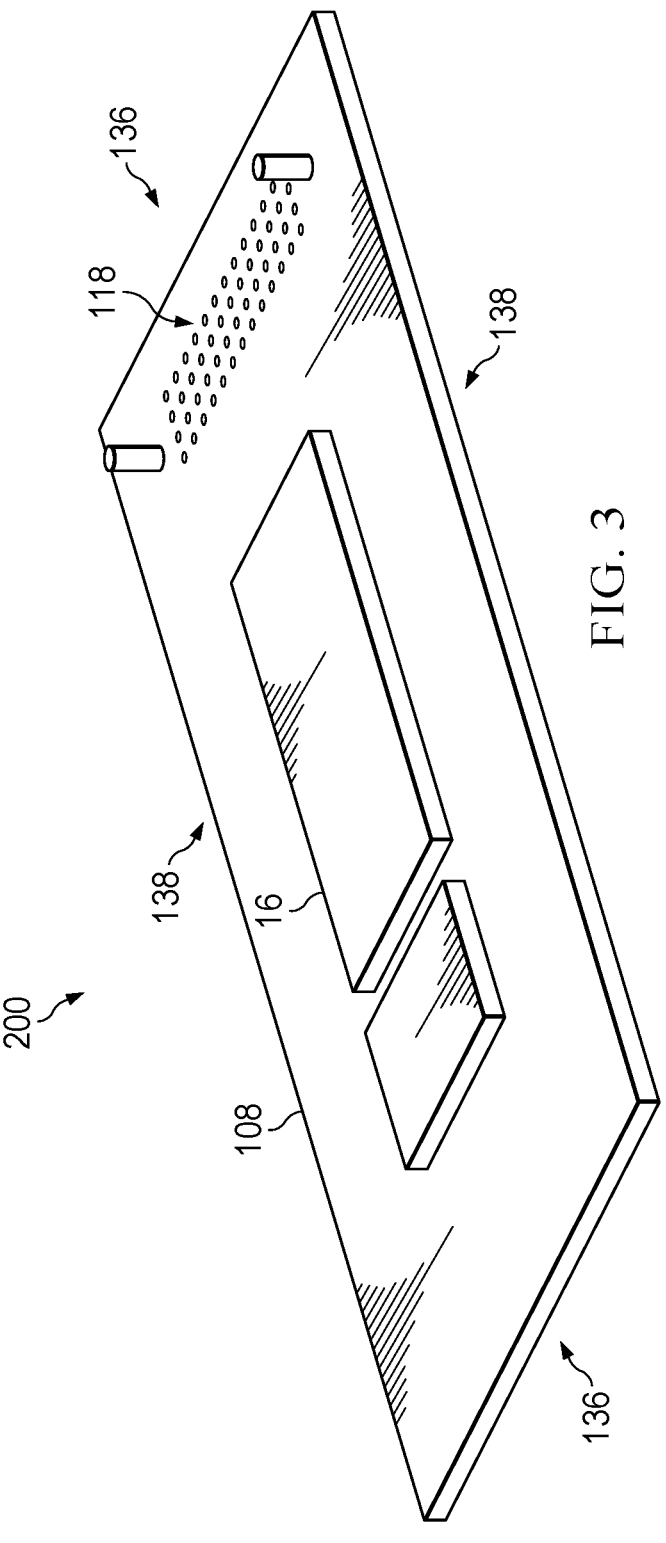
FIG. 3 depicts a perspective view of one embodiment of a chip package, illustrating a substrate with a first set of contacts formed on a surface layer and near an end edge.

Referring to FIG. 3, chip package 200 may be formed with the first set of contacts 118 on a surface layer of substrate 108 a distance from silicon die 16. In some embodiments, substrate 108 may be generally rectangular and defined by two end edges 136 and two side edges 138, wherein side edges 138 may be longer than end edges 136. As depicted in FIG. 3, in some embodiments, the first set of contacts 118 may be formed along a single end edge 136 of substrate 108.

Figure 4:
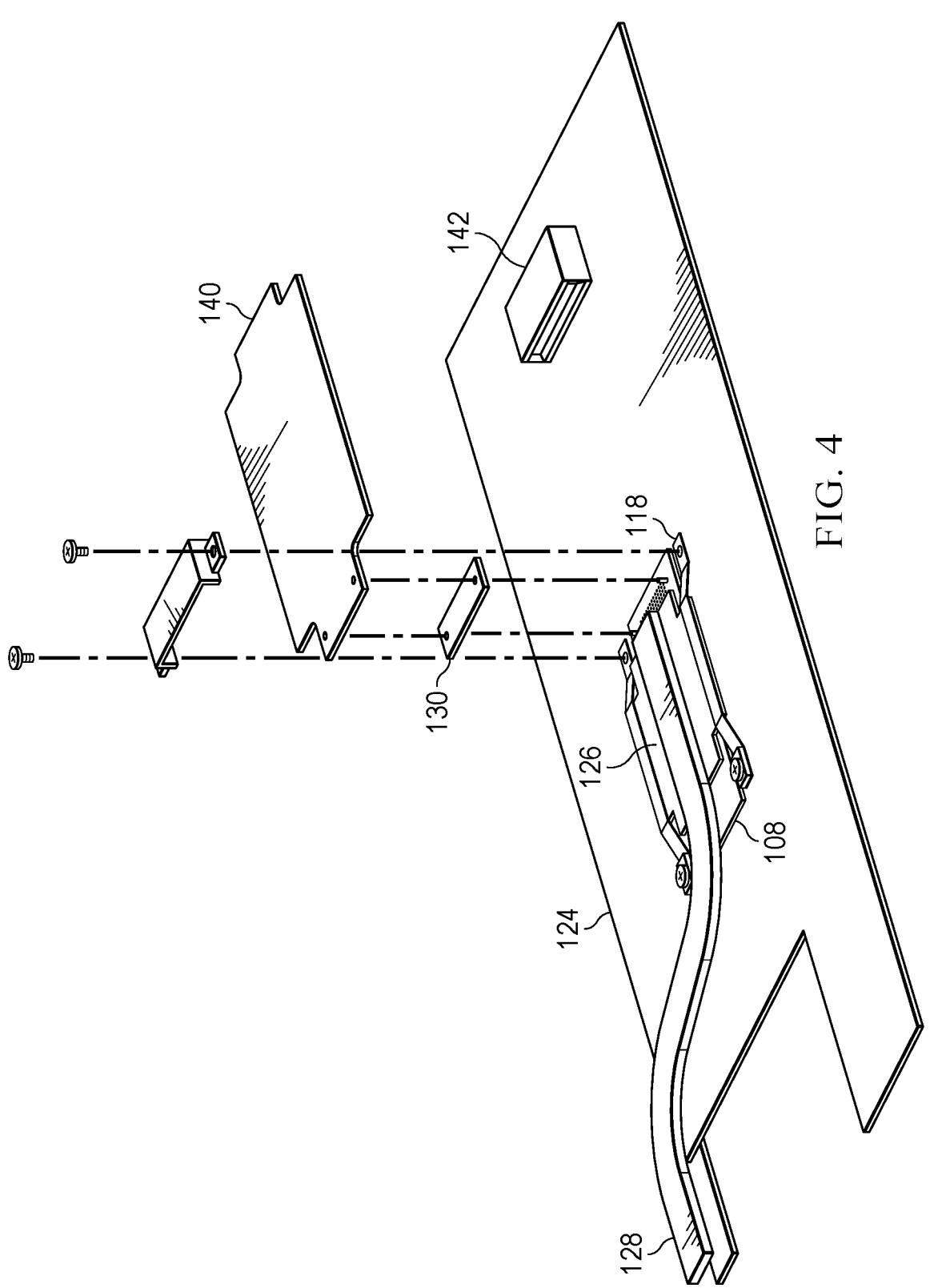
FIG. 4 depicts a perspective view of one embodiment of a PCB with a chip package mounted thereon, illustrating one method for connecting I/O contacts formed on a surface layer of a substrate with a mainboard connector on the PCB.

Referring to FIG. 4, embodiments may be mounted on and communicatively coupled to PCB 124. PCB 124 may be configured with a chip package receiving area that comprises a plurality of power connection points dedicated for connecting with power contacts 120 on chip package 200. In some embodiments, the chip receiving area (not visible) may be configured with a standardized arrangement of power connection points (e.g., ball grid array (BGA) ball connection points and/or capacitor connection points) for receiving power. Heat exchanger 126 may be mounted on chip package 200 and heat pipe 128 may be coupled to heat exchanger 126. Advantageously, a system comprising PCB 124 with chip package 200 mounted thereon provides more flexibility for routing heat pipe 128.

Connection to a PCB without Edge Connectors

Still referring to FIG. 4, embodiments may have connections to PCB 124 at one or more locations other than the chip receiving area. For example, as depicted in FIG. 4, substrate 108 may be formed with a length to extend beyond heat exchanger 126. Compression connector 130 may be positioned to connect with I/O contacts 118 and board connector 140 may be mounted on PCB 124 to connect compression connector 130 to mainboard connector 142. Advantageously, by locating mainboard connector away from a chip receiving area, embodiments may be able to increase the number of I/O contacts 118 and the number of power contacts 120 available for chip package 200.

System Variations to Accommodate Other Configurations

Figure 5:
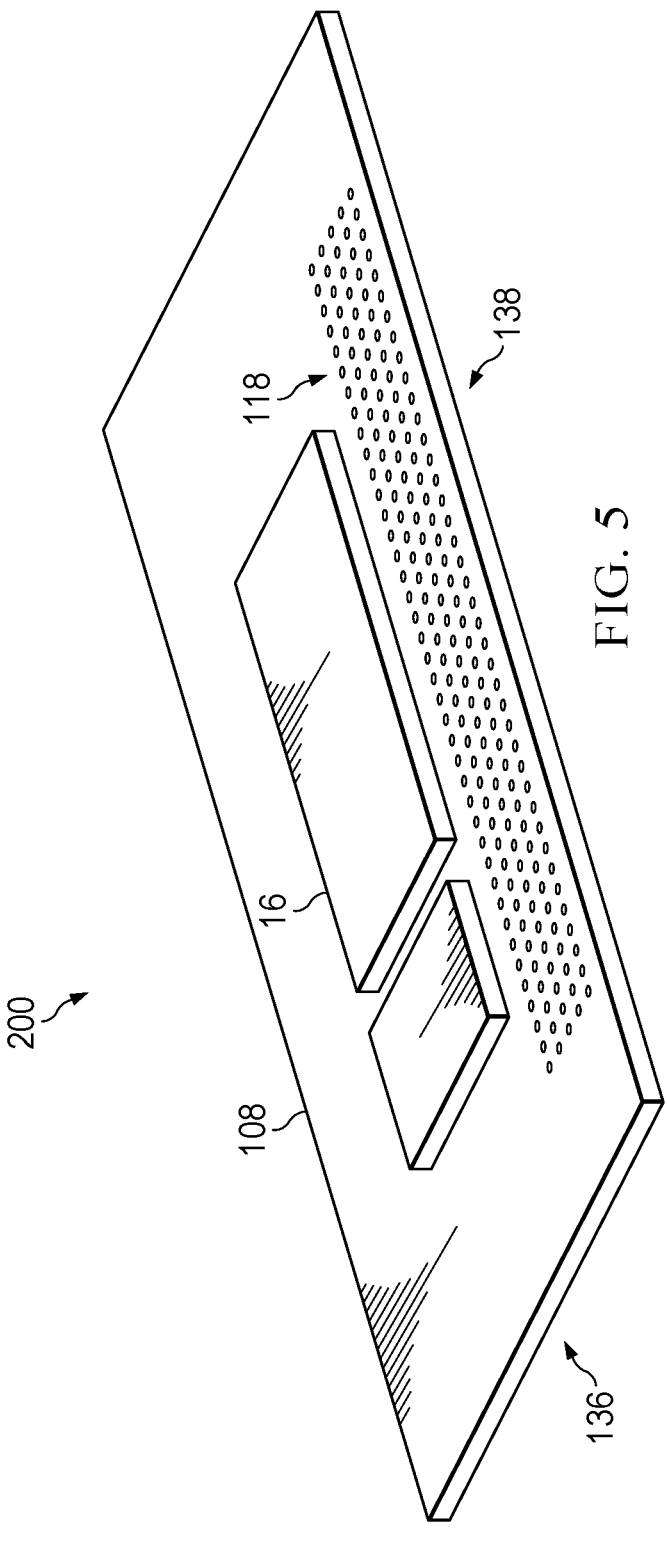
FIG. 5 depicts a perspective view of one embodiment of a chip package, illustrating a substrate with I/O contacts formed on a surface layer and near a side edge.

Referring to FIG. 5, in some embodiments, substrate 108 may be generally rectangular and defined by two end edges 136 and two side edges 138, wherein side edges 138 are longer than end edges 136. As depicted in FIG. 5, in some embodiments, chip package 200 may be formed with I/O contacts 118 formed along a side edge 138 of substrate 108. This arrangement may allow a larger number of the first set of contacts 118. This configuration may be advantageous for use with memory modules. For example, I/O contacts 118 may be formed in an array associated with a double data rate (DDR) or low-power double data rate (LPDDR) memory module.

Figure 6:
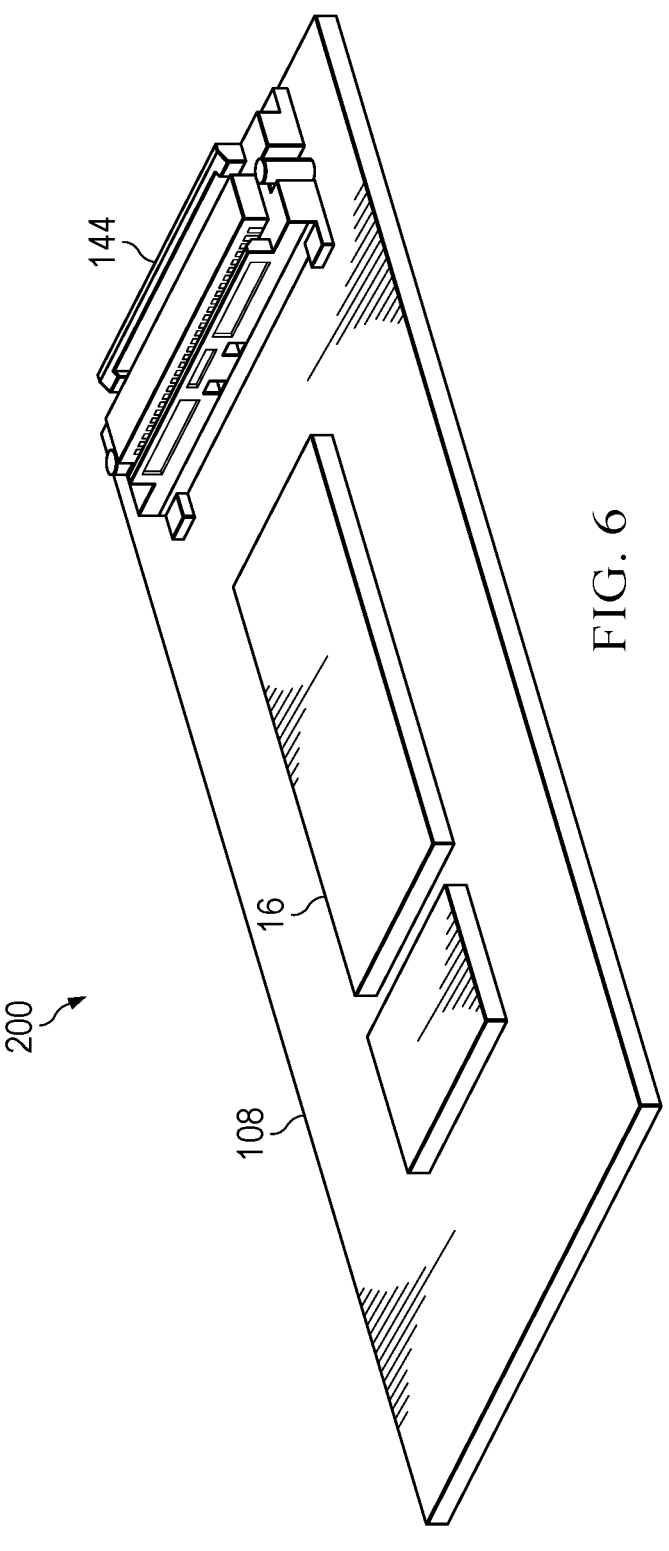
FIG. 6 depicts a perspective view of one embodiment of a chip package, illustrating a substrate with I/O contacts formed on a surface layer and a surface mount connector located a distance from a chip retaining area.
Figure 7:
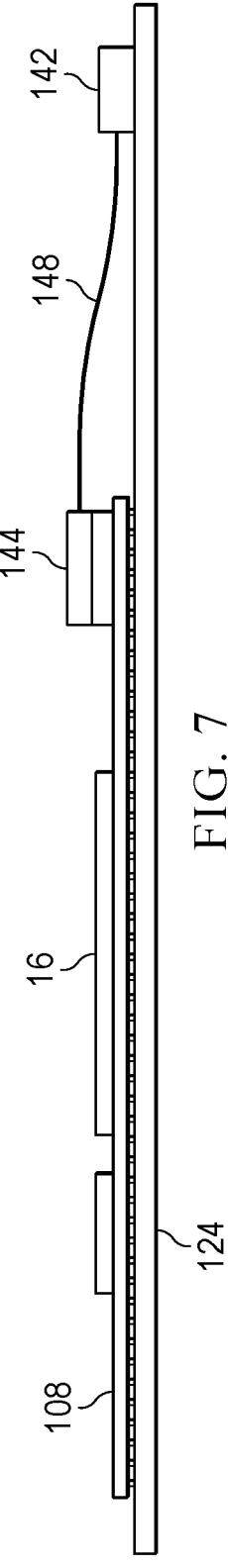
FIG. 7 depicts a cutaway side view of one embodiment of a PCB with a chip package mounted thereon, illustrating one method for connecting I/O contacts formed on a surface layer of a substrate with a mainboard connector on the PCB.

Referring to FIGS. 6 and 7, in some embodiments, chip package 200 may be formed with surface mount connector 144. Surface mount connector 144 may comprise vertical or right-angle connectors. This configuration allows I/O contacts 118 to be connected to mainboard connector 142 using, for example, flexible cable 148.

Advantageously, embodiments allow for variations to accommodate different configurations of processor design, reduce the number of substrate layers, produce a cleaner lay out, and achieve a more compact system design.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A chip package, comprising:
a substrate, comprising:
    a first via;
    a second via;
    a third via;
    a fourth via;
    a first trace connected between the first via and the second via;
    a second trace connected between the third via and the fourth via;
    a plurality of layers, including:
        a first surface layer of the plurality of layers comprises a first set of contacts, wherein each contact in the first set of contacts is a first contact type, a particular first contact of the first set of contacts connected to the first via; and
        a second surface layer of the plurality of layers opposite the first surface layer comprises a second set of contacts, wherein each contact in the second set of contacts is a second contact type that is different than the first contact type, a particular second contact of the second set of contacts connected to the fourth via; and
a silicon die mounted to the first surface layer;
a first power contact positioned between the silicon die and the first surface layer, and in contact with the second via;
a second power contact positioned between the silicon die and the first surface layer, and in contact with the third via;
wherein the particular first contact at the first surface layer is connected to the first power contact through the first via, the first trace and the second via,
wherein the particular second contact at the second surface layer is connected to the second power contact through the fourth via, the second trace, and the third via.

2. The chip package of claim 1, wherein the first set of contacts comprises input/output (I/O) contacts.

3. The chip package of claim 1, wherein the first set of contacts is arranged proximate an edge of the substrate.

4. The chip package of claim 3, wherein the substrate is substantially rectangular and defined by two end edges and two side edges, wherein the two side edges are longer than the two end edges, wherein the first set of contacts is arranged proximate to a side edge of the substrate.

5. The chip package of claim 3, wherein the substrate is substantially rectangular and defined by two end edges and two side edges, wherein the two side edges are longer than the two end edges, wherein the first set of contacts is arranged proximate to an end edge of the substrate.

6. The chip package of claim 1, further comprising a first surface mount connector coupled to the first set of contacts.

7. The chip package of claim 1, wherein the second set of contacts comprises power contacts.

8. A system comprising:
a printed circuit board (PCB) with a mainboard connector;
a chip package comprising:
    a substrate, comprising:

a first via;
        a second via;
        a third via;
        a fourth via;
        a first trace connected between the first via and the second via;
        a second trace connected between the third via and the fourth via;
        a plurality of layers, including:
            a first surface layer of the plurality of layers comprises a first set of contacts, wherein each contact in the first set of contacts is a first contact type, a particular first contact of the first set of contacts connected to the first via; and
            a second surface layer of the plurality of layers opposite the first surface layer comprises a second set of contacts, wherein each contact in the second set of contacts is a second contact type that is different than the first contact type, a particular second contact of the second set of contacts connected to the fourth via; and
    a silicon die mounted to the first surface layer;
    a first power contact positioned between the silicon die and the first surface layer, and in contact with the second via;
    a second power contact positioned between the silicon die and the first surface layer, and in contact with the third via;
    wherein the particular first contact at the first surface layer is ultimately connected to the first power contact through the first via, the first trace and the second via,
    wherein the particular second contact at the second surface layer is ultimately connected to the second power contact through the fourth via, the second trace, and the third via,
    a connector coupling the first set of contacts to the mainboard connector.

9. The chassis of claim 8, wherein the first set of contacts comprises input/output (I/O) contacts.

10. The chassis of claim 8, wherein the first set of contacts is arranged proximate an edge of the substrate.

11. The chassis of claim 10, wherein the substrate is substantially rectangular and defined by two end edges and two side edges, wherein the two side edges are longer than the two end edges, wherein the first set of contacts is arranged proximate to a side edge of the substrate.

12. The chassis of claim 10, wherein the substrate is substantially rectangular and defined by two end edges and two side edges, wherein the two side edges are longer than the two end edges, wherein the first set of contacts is arranged proximate to an end edge of the substrate.

13. The chassis of claim 8, wherein the connector coupling the first set of contacts to the mainboard connector comprises:
a surface mount connector mounted on the substrate; and
a cable connecting the surface mount connector to the mainboard connector.

14. The chassis of claim 8, wherein the connector coupling the first set of contacts to the mainboard connector comprises:
a compression connector mounted on the substrate; and
a cable connecting the surface mount connector to the mainboard connector.

15. A method of connecting a chip package to a printed circuit board (PCB), the method comprising:
forming a substrate, comprising:

forming a first via, a second via, a third via, and a fourth via;

forming a first trace connected between the first via and the second via;

forming a second trace connected between the third via and the fourth via;

forming a first surface layer of the plurality of layers with a first set of contacts, wherein each contact in the first set of contacts is a first contact type a particular first contact of the first set of contacts connected to the first via; and forming a second surface layer of the plurality of layers opposite the first surface layer with a second set of contacts, wherein each contact in the second set of contacts is a second contact type that is different than the first contact type, a particular second contact of the second set of contacts connected to the fourth via;

mounting a silicon die to the first surface layer,
  wherein a first power contact is positioned between the silicon die and the first surface layer, and in contact with the second via;
  wherein a second power contact is positioned between the silicon die and the first surface layer, and in contact with the third via;

mounting the substrate in a chip receiving area on a PCB, wherein the second set of contacts are connected to chip connection points;

contacting a first end of a connector to the first set of contacts; and contacting a second end of the connector to a mainboard connector on the PCB, wherein the particular first contact at the first surface layer is ultimately connected to the first power contact through the first via, the first trace and the second via, wherein the particular second contact at the second surface layer is ultimately connected to the second power contact through the fourth via, the second trace, and the third via.

16. The method of claim 15, wherein the connector comprises a flexible cable.

17. The method of claim 15, wherein:
  contacting the first end of the connector to the first set of contacts comprises:
  positioning a compression connector relative to the first set of contacts; and
  contacting a first end of a board connector with the compression connector; and
  contacting the second end of the connector to the mainboard connector on the PCB comprises contacting a second end of the board connector to the mainboard connector.

18. The method of claim 15, wherein forming the first surface layer of the plurality of layers with the first set of contacts comprises forming the first set of contacts proximate an end edge of the substrate.

19. The method of claim 15, wherein forming the first surface layer of the plurality of layers with the first set of contacts comprises forming the first set of contacts proximate a side edge of the substrate.

20. The method of claim 15, wherein forming the first surface layer of the plurality of layers with the first set of contacts comprises forming the first set of contacts proximate two or more edges of the substrate.

\* \* \* \* \*